United States Patent
Chachad et al.

(10) Patent No.: US 8,582,384 B1
(45) Date of Patent: Nov. 12, 2013

(54) PROCESS VARIABILITY TOLERANT PROGRAMMABLE MEMORY CONTROLLER FOR A PIPELINED MEMORY SYSTEM

(71) Applicant: Texas Instruments Incorporated, Dallas, TX (US)

(72) Inventors: Abhijeet A. Chachad, Plano, TX (US); Ramakrishnan Venkatasubramanian, Plano, TX (US); Raguram Damodaran, Raleigh, NC (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/918,276

(22) Filed: Jun. 14, 2013

Related U.S. Application Data

(62) Division of application No. 13/184,873, filed on Jul. 18, 2011, now Pat. No. 8,488,405.

(51) Int. Cl.
*G11C 17/18* (2006.01)

(52) U.S. Cl.
USPC .................. 365/225.7; 365/96; 365/194

(58) Field of Classification Search
USPC ......... 365/96, 189.011–225.7, 230.01–243.5; 257/50, 529, 530
See application file for complete search history.

(56) References Cited

U.S. PATENT DOCUMENTS 6,134,178 A * 10/2000 Yamazaki et al. ....... 365/233.17
6,154,417 A * 11/2000 Kim ............................ 365/233.1

* cited by examiner

*Primary Examiner* — Harry W Byrne
(74) *Attorney, Agent, or Firm* — John R. Pessetto; W. James Brady; Frederick J. Telecky, Jr.

(57) ABSTRACT

In an embodiment of the invention, an integrated circuit includes a pipelined memory array and a memory control circuit. The pipelined memory array contains a plurality of memory banks. Based partially on the read access time information of a memory bank, the memory control circuit is configured to select the number of clock cycles used during read latency.

5 Claims, 4 Drawing Sheets

PROCESS VARIABILITY TOLERANT PROGRAMMABLE MEMORY CONTROLLER FOR A PIPELINED MEMORY SYSTEM

This application is a divisional of prior application Ser. No. 13/184,873, filed Jul. 18, 2011 now U.S. Pat. No. 8,488,405, issued Jul. 16, 2013.

BACKGROUND

A pipeline with respect to a computer is the continuous and somewhat overlapped movement of data to a processor. Pipelining is the use of a pipeline. Without a pipeline, a computer processor gets the first instruction from memory, performs the operation it calls for, and then goes to get the next instruction from memory. While fetching (getting) the instruction, the arithmetic and logic unit (ALU) of the processor is idle. The processor usually has to wait until it gets the next instruction.

With pipelining, a computer architecture allows the next instructions to be fetched while the processor is performing arithmetic operations, holding them in a buffer close to the processor until each instruction operation can be performed. The staging of instruction fetching is continuous. The result is an increase in the number of instructions that can be performed during a given time period.

Computer processor pipelining is sometimes divided into an instruction pipeline and an arithmetic pipeline. The instruction pipeline represents the stages in which an instruction is moved through the processor, including its being fetched, perhaps buffered, and then executed. The arithmetic pipeline represents the parts of an arithmetic operation that can be broken down and overlapped as they are performed.

Pipelines and pipelining also apply to computer memory controllers and moving data through various memory staging places. Data may be pipelined (written or read) to banks of memory when the memory addresses have some order. For example, writing or reading data that have consecutive addresses allows data to be pipelined from different memory banks. However, when a non-sequential read or write occurs, data pipelining is interrupted and the full access time of the memory is required to complete the read or write of the memory. The access time may be 3 or 4 clock cycles for example.

Because the read access time of memory may not be known until the memory is fabricated, the read latency (the number of clock cycles needed to access the data from memory) time may not be known until the memory is fabricated. After the memory if fabricated, a longer read latency than calculated may be needed because the memory is slower than expected due to variations of parameters in the process (e.g. threshold voltages, the length of transistors, capacitance values etc.) of fabrication or a shorter read latency than calculated may be needed because the memory is faster than expected due to variations of parameters in the process of fabrication.

A memory controller, in order to make efficient use of pipelining in memory, needs to "know" the actual read access time of memory. When the actual read access of the memory is known, a controller can allocate the number of clock cycles needed for read latency of a fabricated pipelined memory array. A memory controller that can be programmed based on actual measured read access times of fabricated memories can improve the speed at which data may be accessed in memory.

DETAILED DESCRIPTION

The drawings and description, in general, disclose a memory control circuit that controls a pipelined memory array. The pipelined memory array contains memory banks. The read access time of memory banks is usually greater than one clock cycle because a memory bank may contain 1 million bits or more of SRAM (Static Random Access Memory) storage and because the clock may be running at frequencies of 1 GHz or higher. Because the read access time of these memory banks is usually greater than a clock cycle, the memory control circuit must allow for the appropriate number of clock cycles to pass before reading an accessed memory bank. The estimated read access time of a memory bank is usually slower than actual measured read access times because most integrated circuits are designed for the worst case (i.e. the slowest case).

The actual read access time of a memory bank is not known until it can be measured on a integrated circuit. The actual read access time of the memory bank can vary greatly depending on many factors related to the process where the memory bank was fabricated. Because the actual read access time of memory is not accurately known until it is measured, the number of clock cycles needed during a read access of a memory bank is conservatively estimated by the memory control circuit. A conservative estimate usually uses more clock cycles than is needed. Because more clock cycles may be used than are needed, the speed at which data may be read from a memory array is reduced.

In an embodiment of the invention, measured read access information from a fabricated memory bank is provided to the memory control circuit. This information, for example, may be provided by pins on the integrated circuit that contains the memory control circuit or by programmable registers for example. In this embodiment, the memory control circuit uses the measured read access information to control the number of clock cycles that must occur before reading data from an addressed memory bank. Because the measured read access information is more accurate than computer modeling estimates, extra clock cycles are not used and the efficiency of the memory array is improved.

Figure 1:
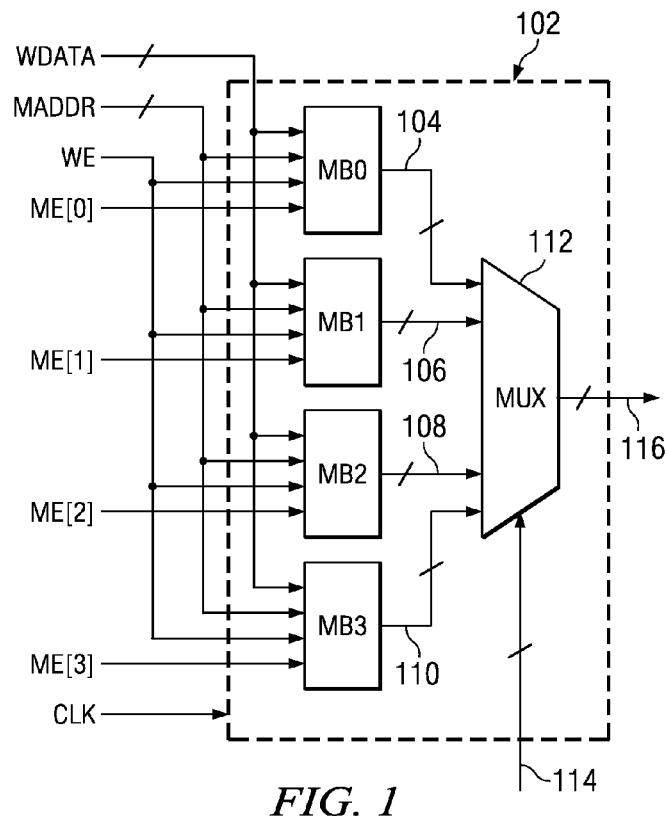
FIG. 1 is a block diagram of an embodiment of a pipelined memory array having four memory banks.

FIG. 1 is a block diagram of an embodiment of a pipelined memory array 102 having four memory banks MB0, MB1, MB2 and MB3. The pipelined memory array 102 may be a custom hard-wired macro for example. Each memory bank MB0, MB1, MB2 and MB3 has a write enable signal WE as an input. In addition, each memory bank MB0, MB1, MB2 and MB3 has input WDATA where data may be written to the individual memory bank when both the write enable signal WE and ME signal are asserted.

Each memory bank MB0, MB1, MB2 and MB3 is addressed with a mapped address MADDR. The mapped address is provided by a memory control circuit. The memory control circuit interleaves addresses such that consecutive addresses address a different memory bank. For example when there are four memory banks, the two least significant bits of an address may be used to determine which bank is addressed. For example least significant bits 00 would select memory bank MB0, least significant bits 01 would select memory bank MB1, least significant bits 10 would select memory bank MB2 and least significant bits 11 would select memory bank MB3.

In this example memory enable signals ME[3:0] are provided by a memory controller to select which memory bank MB0, MB1, MB2 or MB3 is addressed. Memory enable signal ME[0] selects memory bank MB0. Memory enable signal ME[1] selects memory bank MB1. Memory enable signal ME[2] selects memory bank MB2. Memory enable signal ME[3] selects memory bank MB3. A clock signal CLK is connected to the pipelined memory array 102.

The outputs 104, 106, 108 and 110 of memory banks MB0, MB1, MB2 and MB3 respectively are inputs to the multiplexer 112. Select signal 114 selects which input of the multiplexer 112 is transferred to the output 116 of the multiplexer. In this embodiment, a time-delayed version of ME[3:0] are used to select which input of the multiplexer 112 is transferred to the output 116 of the multiplexer.

Figure 2:
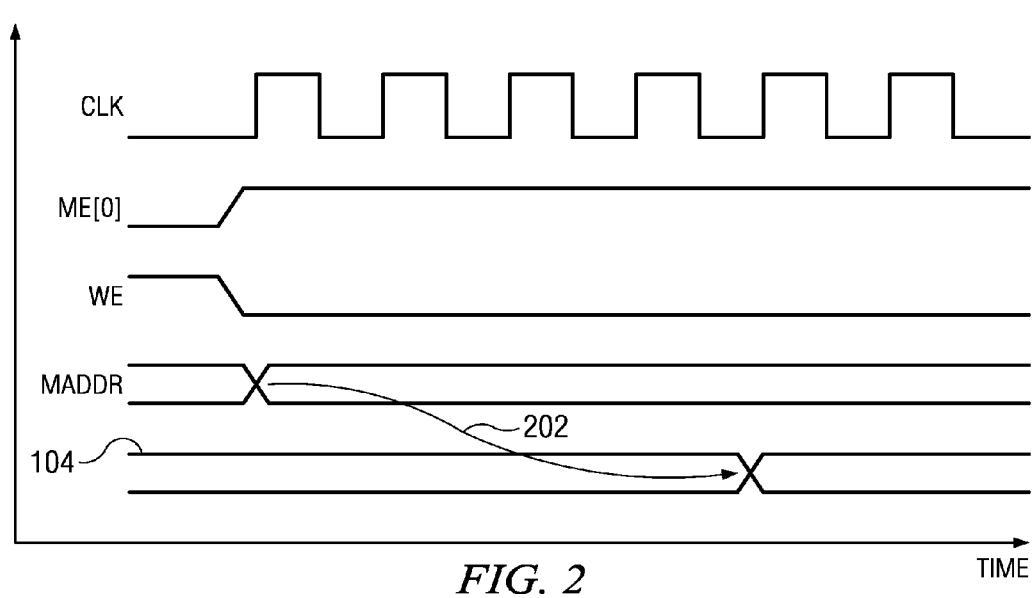
FIG. 2 is a timing diagram illustrating an embodiment of a read access time of memory bank 0.

FIG. 2 is a timing diagram illustrating an embodiment of a read access time of memory bank 0. In this example when memory enable signal ME[0] is activated (e.g. a high logical value), memory bank MB0 can be accessed. In the example shown in FIG. 2, a read access may occur in memory bank MB0 because the write enable signal WE is inactivated (e.g. a low logical level). When an address MADDR is applied to memory bank MB0, data from the output 104 of memory bank MB0 may be accessed. Read access time 202 is the time required to receive data at the output of a memory back from the time the memory bank is addressed. Read access time is measured in seconds.

In this example, the clock period is 833 picoseconds and the clock frequency is 1.2 GHz. The read access time 202 of memory bank MB0 is 2.9 nanoseconds. Because the read access time of is greater than 3 clock periods, four clock cycles are required before data will be available at the output 104 of memory bank MB0. Read latency is the number of clock cycles that must elapse before data is available at the output of a memory bank. In this example, because four clock cycles were required before data was available at the output of the memory bank, the read latency is four. Read latency is measured in clock cycles where clock cycles are an integer value.

Access latency is the number of clock cycles that must expire before a memory bank may be accessed (written to or read from) again. In the example shown in FIG. 2, four clock cycles must elapse before memory bank MB0 may be accessed again.

Figure 3:
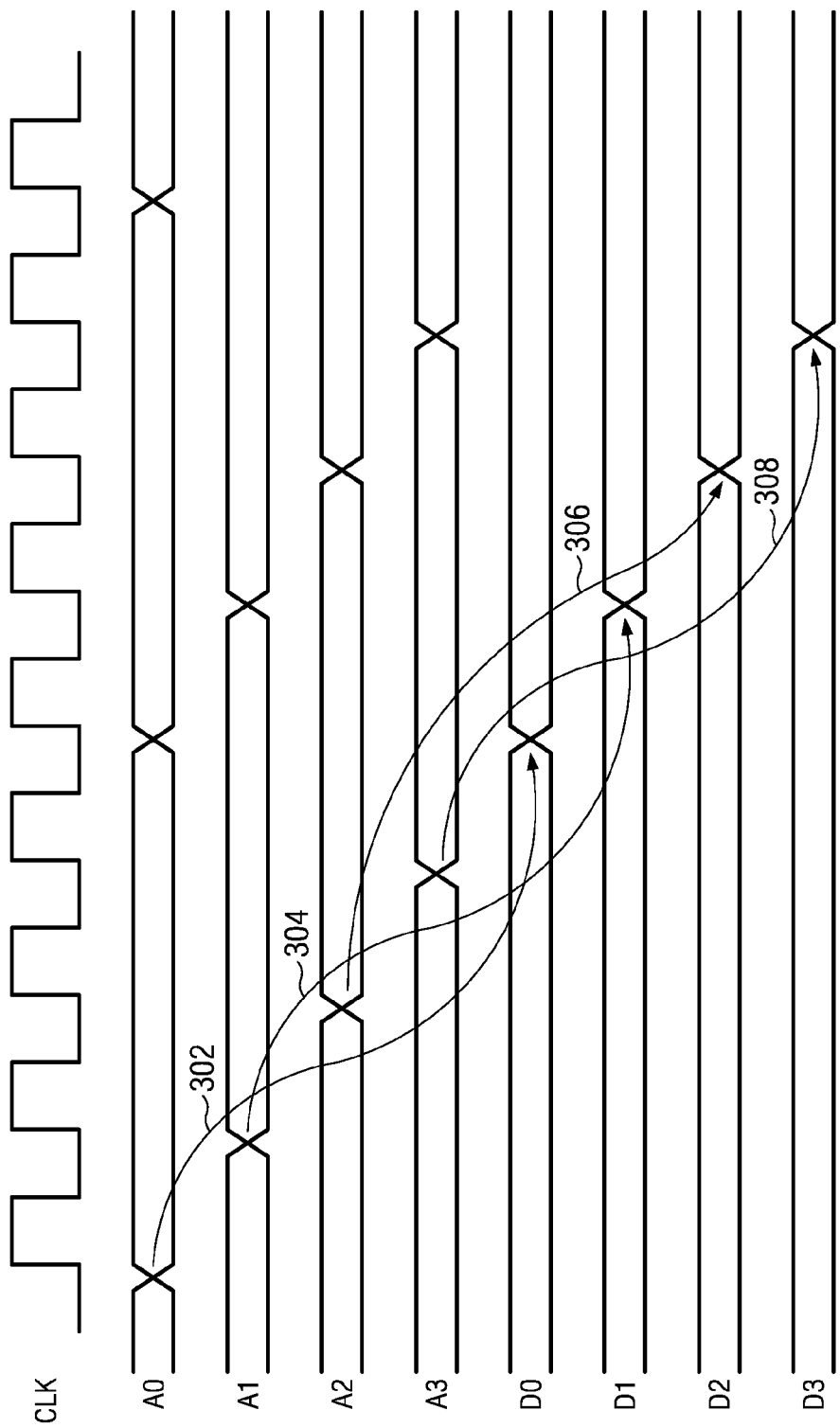
FIG. 3 is a timing diagram illustrating an embodiment of a pipelined memory array where consecutive read accesses are interleaved between four memory banks.

FIG. 3 is a timing diagram illustrating an embodiment of a pipelined memory array 102 where consecutive read accesses are interleaved between four memory banks MB0, MB1, MB2 and MB3. In this example, read accesses may occur after one clock cycle because a memory controller interleaved or "mapped" consecutive address to be applied to a different memory bank after each access.

A read address A0 is applied to memory bank MB0 before the rising edge of clock signal CLK. The data D0 from memory bank MB0 can not be read until four clock cycles after read address A0 is applied. However, because the read addresses are consecutive and address a different memory bank on each clock cycle, a second read address A1 can be applied to memory bank MB1 one clock cycle after the read address A0 is applied to memory bank MB0. The data D1 from memory bank MB1 can not be read until four clock cycles after read address A1 is applied.

Because the read addresses are consecutive and address a different memory bank on each clock cycle, a third read address A2 can be applied to memory bank MB2 one clock cycle after the read address A1 is applied to memory bank MB1. The data D2 from memory bank MB2 can not be read until four clock cycles after read address A2 is applied. A fourth read address A3 can be applied to memory bank MB3 one clock cycle after the read address A2 is applied to memory bank MB2. The data D2 from memory bank MB2 can not be read until four clock cycles after read address A2 is applied.

The read access times of memory banks MB0, MB1, MB2 and MB3 are indicated by arrows 302, 304, 306 and 308 respectively. In this example, the read access times are approximately 2.9 nanoseconds (greater than three clock cycles). However, once the "pipe" is full, data may be read from the pipelined memory array 102 every clock cycle. D1 follows D0 after one clock cycle. D2 follows D1 after one clock cycle. D3 follows D2 after one clock cycle. The pipelined memory array 102 may continue to read data every clock cycle as long as the addresses are consecutive. However, when a random read address occurs, the pipeline "stalls" and data from the output 116 of the pipelined memory array 102 can not be obtained until four clock cycles (its access latency) have expired.

Figure 4:
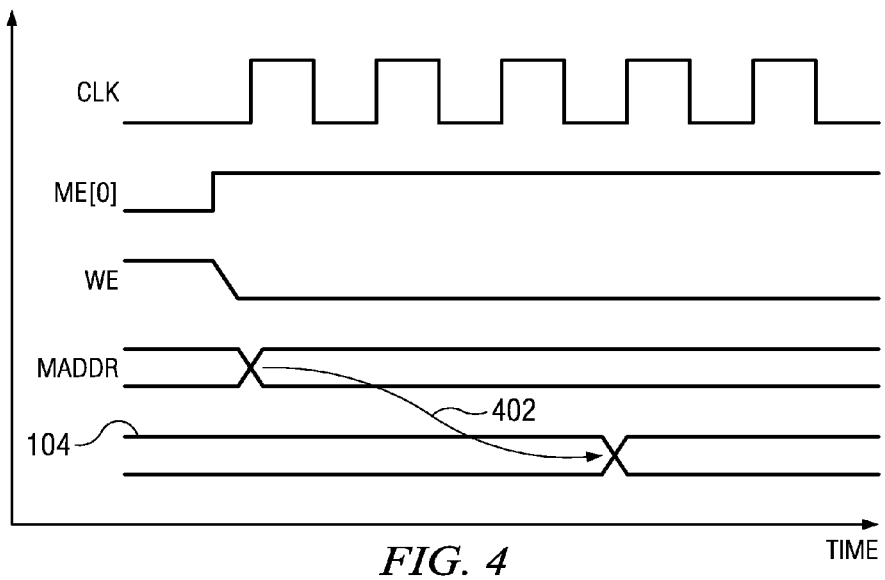
FIG. 4 is a timing diagram illustrating an embodiment of a read access time of memory bank 0.

FIG. 4 is a timing diagram illustrating an embodiment of a read access time of memory bank 0. In this example when memory enable signal ME[0] is activated (e.g. a high logical value), memory bank MB0 can be accessed. In the example shown in FIG. 4, a read access may occur in memory bank MB0 because the write enable signal WE is inactivated (e.g. a low logical level). When an address MADDR is applied to memory bank MB0, data from the output 104 of memory bank MB0 may be accessed. Read access time 402 is the time required to receive data at the output of a memory back from the time the memory bank is addressed. Read access time is measured in seconds.

In this example, the clock period is 833 picoseconds and the clock frequency is 1.2 GHz. The read access time 402 of memory bank MB0 is 2.2 nanoseconds. The read access time 402 in this example is faster than the read access time shown in FIG. 2. As a consequence, only 3 clock cycles are required before data will be available at the output 104 of memory bank MB0. Read latency is the number of clock cycles that must elapse before data is available at the output of a memory bank. In this example, because three clock cycles were required before data was available at the output of the memory bank, the read latency is three.

The read access time 402 in FIG. 4 may be faster than the read access time in FIG. 2 for several reasons. For example, the particular integrated circuit the memory bank MB0 was fabricated on may have process variations (e.g. shorter transistor lengths, lower threshold voltages, higher transconductance etc.) that make the access time faster. If the read latency remained four clock cycles, the pipelined memory array 102 would not have been able to take advantage of the improved read access time shown in FIG. 4. Because the read latency in FIG. 4 is three clock cycles instead of four clock cycles, the performance of the pipelined memory array 102 can be faster. The access latency however remains four clock cycles.

Figure 5:
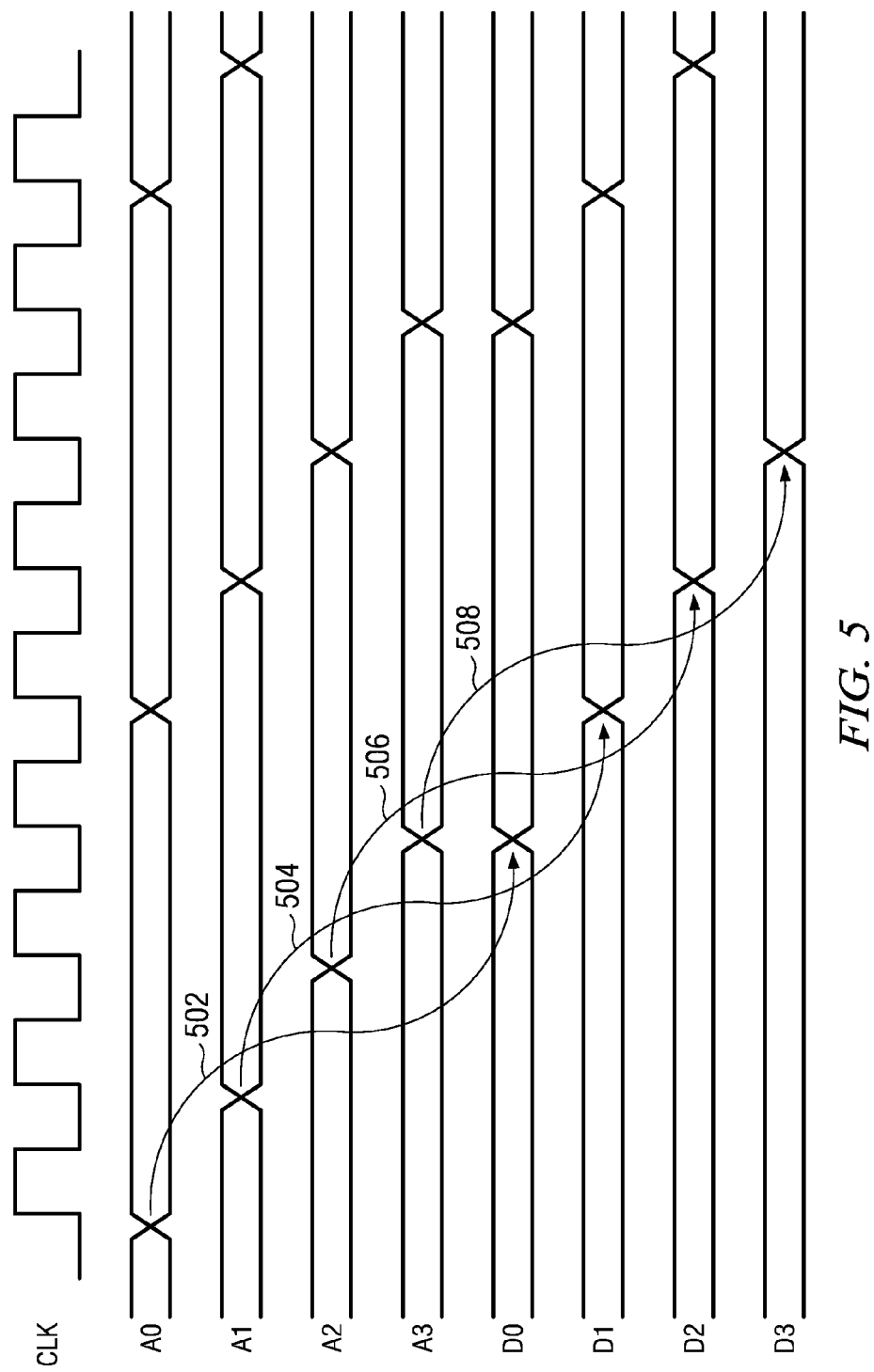
FIG. 5 is a timing diagram illustrating an embodiment of a pipelined memory array where consecutive read accesses are interleaved between four memory banks.

FIG. 5 is a timing diagram illustrating an embodiment of a pipelined memory array 102 where consecutive read accesses are interleaved between four memory banks MB0, MB1, MB2 and MB3. In this example, read accesses may occur after one clock cycle because a memory controller interleaved or "mapped" consecutive address to be applied to a different memory bank after each access.

A read address A0 is applied to memory bank MB0 before the rising edge of clock signal CLK. The data D0 from memory bank MB0 can not be read until three clock cycles after read address A0 is applied. However, because the read addresses are consecutive and address a different memory bank on each clock cycle, a second read address A1 can be applied to memory bank MB1 one clock cycle after the read address A0 is applied to memory bank MB0. The data D1 from memory bank MB1 can not be read until three clock cycles after read address A1 is applied.

Because the read addresses are consecutive and address a different memory bank on each clock cycle, a third read address A2 can be applied to memory bank MB2 one clock cycle after the read address A1 is applied to memory bank MB1. The data D2 from memory bank MB2 can not be read until three clock cycles after read address A2 is applied. A fourth read address A3 can be applied to memory bank MB3 one clock cycle after the read address A2 is applied to memory bank MB2. The data D2 from memory bank MB2 can not be read until three clock cycles after read address A2 is applied.

The read access times of memory banks MB0, MB1, MB2 and MB3 are indicated by arrows 502, 504, 506 and 508 respectively. In this example, the read access times are approximately 2.2 nanoseconds (greater than two clock cycles). However, once the "pipe" is full, data may be read from the pipelined memory array 102 every clock cycle. D1 follows D0 after one clock cycle. D2 follows D1 after one clock cycle. D3 follows D2 after one clock cycle. The pipelined memory array 102 may continue to read data every clock cycle as long as the addresses are consecutive. However, when a random read address occurs, the pipeline "stalls" and data from the output 116 of the pipelined memory array 102 can not be obtained every clock cycle.

Because the read latency is three clock cycles in FIG. 4 instead of four clock cycles as shown in FIG. 2, a DSP (digital signal processor) or a microprocessor fetching data from the pipelined memory array 102 would only be stalled for three clock cycles rather than four clock cycles. This would result in a faster unstalling of a CPU (central processing unit) thereby increasing the instructions per cycle (IPC) of the DSP or microprocessor.

Due to process variations (e.g. changes in the length of transistors, changes in the threshold voltages, changes in capacitance etc.) when a memory bank is fabricated, a memory bank designed for a read latency of three clock cycles can slow to a read latency of four clock cycles or a memory bank designed for a read latency of four clock cycles can speed up to a read latency of three clock cycles. In an embodiment of this invention a memory control circuit can be "dialed-in" to adjust the read latency of a pipelined memory array based on the measured read access time information of memory banks. The measured read access time information may be provided to the memory control circuit for example by pins on the integrated circuit that contains the memory control circuit or by "blowing" fuses in efuse registers on the integrated circuit that contains the memory control circuit.

In computing, an efuse is a technology which allows for the dynamic real-time reprogramming of integrated circuits. Computer logic is generally 'etched' or 'hard-coded' onto a chip and cannot be changed after the chip has finished being manufactured. By utilizing a number of individual efuses an integrated circuit manufacturer can allow for the circuits on a chip to change while it is in operation. The integrated circuit can change its behavior by blowing an efuse.

When the read access time of memory bank increases, the memory control circuit can be programmed to take extra clock cycles for read latency and not change the clock frequency. When the read access time of memory bank decreases, the memory control circuit can be programmed to take fewer clock cycles for read latency and not change the clock frequency. This operation is transparent to an application running on the processor or DSP. Changing the read latency is transparent to applications running of the DSP or processor.

Figure 6:
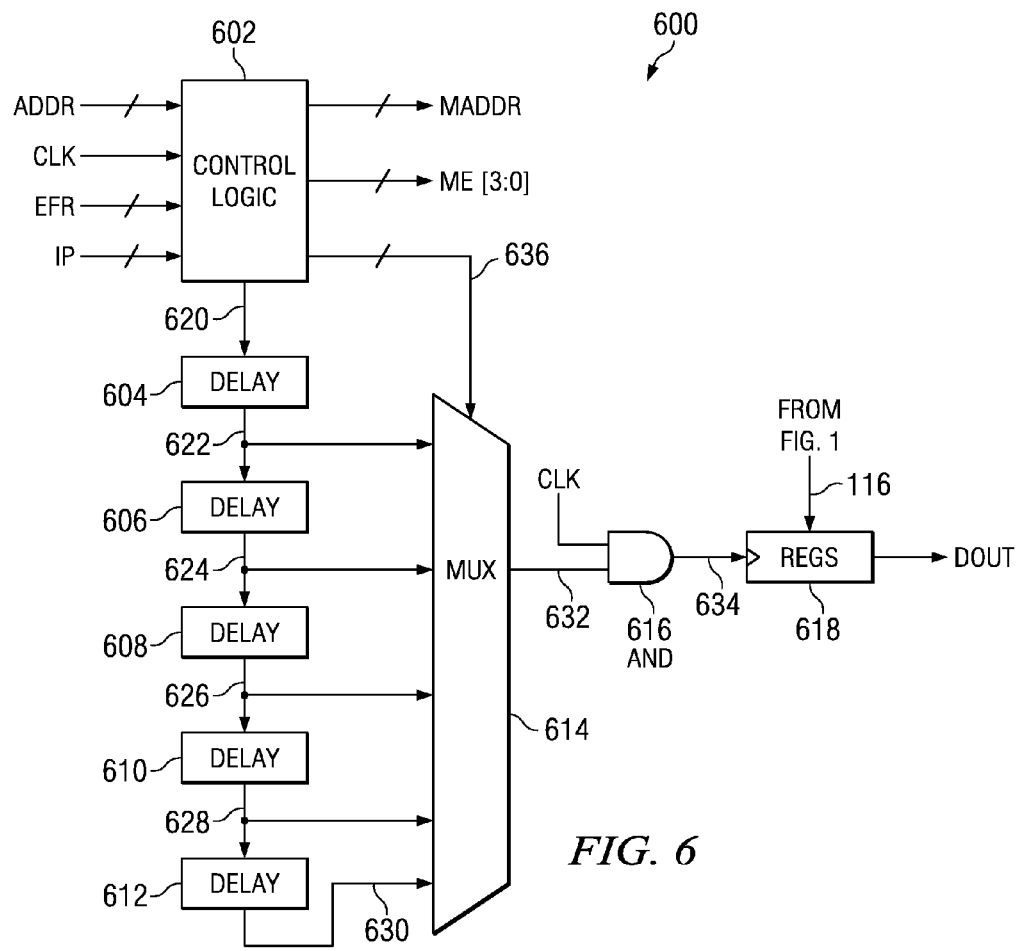
FIG. 6 is a schematic of an embodiment of a memory control circuit for controlling the read latency of a pipelined memory array.

FIG. 6 is a schematic of an embodiment of a memory control circuit 600 for controlling the read latency of a pipelined memory array 102. In this embodiment, address ADDR, clock signal CLK, data from efuse registers EFR and data from information pins IP on the integrated circuit that contains the memory control circuit 600 are input to a control logic block (i.e. a state machine) 602. From these inputs, the control logic block outputs mapped address signals MADDR, memory enable signals ME[3:0], a delay signal 620 and delay select signals 636.

The mapped address MADDR signals are generated to allow pipelining of access to the pipelined memory array 102. Consecutive MADDR signals are interleaved between the four memory banks MB0, MB1, MB2 and MB32. The memory enable signals ME[3:0] select which of the four memory banks MB0, MB1, MB2 and MB32 is selected when reading or writing to the pipelined memory array 102. The delay signal 620 is propagated through delay blocks 604, 606, 608, 610 and 612 to create delay signals 622, 624, 626, 628 and 630 with different delay times. In this embodiment five delay blocks are used. However, more or fewer delay blocks may be used to create delay signals.

The delay select signals 636 are used to select one of the delay signals 622, 624, 626, 628 and 630 that will be transferred to the output 632 of multiplexer 614. In this embodiment of the invention, which delay signal is output is determined by data from efuse registers EFR or data from information pins IP. The data provided from EFR and IP contains information related to measured read access times of memory banks. Using this information, the control logic block can select a delay that will determine the minimum number of clock cycles needed for read latency of a particular pipelined memory array. The output 632 of the multiplexer 614 is ANDed with a clock signal. The output 634 of the AND circuit 616 is used to control when data 116 read from the pipelined memory array 102 is latched in registers 618.

When more clock cycles are needed for a read latency, delay signals 628 or 630, for example, could be used to delay the time when data from the output 116 of the pipelined memory array 102 is captured in the registers 618. When fewer clock cycles are need for a read latency, delay signals 622 or 624, for example, could be used to decrease the time when data from the output 116 of the pipelined memory array 102 is captured in the registers 618.

In the embodiments discussed previously, four memory banks MB0, MB1, MB2 and MB3 were used in the pipelined memory array 102. However, more or fewer memory banks may be used.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A computer system comprising:
    a pipelined memory array, the pipelined memory array comprising a plurality of memory banks;
    a memory control circuit configured to select the number of clock cycles used for a read latency in the pipelined memory array partially based on the read access time information of a memory bank,
    wherein the read access time information of the memory bank is provided to the memory control circuit through one or more efuse registers.

2. The computer system of claim 1 wherein the read access time information of the memory bank is provided to the memory control circuit through one or more pins on an integrated circuit that contains the memory control circuit.

3. The computer system of claim 1 wherein the memory control circuit controls how much time expires between consecutive accesses of a particular memory bank in the plurality of memory banks.

4. The computer system of claim 3 wherein the time that expires between consecutive accesses of the particular memory bank in the plurality of memory banks is equal to or greater than an access latency.

5. The computer system of claim 1 wherein data may be read from the pipelined memory array every clock cycle when the read access addresses are consecutive.

* * * * *